US012625014B2

(12) United States Patent (10) Patent No.: US 12,625,014 B2

El-Barbari (45) Date of Patent: May 12, 2026

(54) METHOD AND ELECTRONIC DEVICE FOR MONITORING THE TEMPERATURE OF POWER ELECTRONICS, AND MOTOR VEHICLE

(71) Applicant: Bayerische Motoren Werke Aktiengesellschaft, Munich (DE)

(72) Inventor: Said El-Barbari, Freising (DE)

(73) Assignee: Bayerische Motoren Werke Aktiengesellschaft, Munich (DE)

(*) Notice: Subject to any disclaimer, the term of this patent is extended or adjusted under 35 U.S.C. 154(b) by 618 days.

(21) Appl. No.: 17/353,166

(22) Filed: Jun. 21, 2021

(65) Prior Publication Data

US 2021/0396600 A1 Dec. 23, 2021

(30) Foreign Application Priority Data

Jun. 22, 2020 (DE) ..................... 10 2020 116 424.6

(51) Int. Cl.
G01K 7/42 (2006.01)
G01K 7/22 (2006.01)
(Continued)

(52) U.S. Cl.
CPC .............. G01K 7/425 (2013.01); G01K 7/22 (2013.01); H02M 1/32 (2013.01);
(Continued)

(58) Field of Classification Search
CPC .......... G01K 7/425; G01K 7/22; H01L 23/34; H02M 1/32; H03K 17/0822; H03K 2017/0806; H03K 2217/0027
See application file for complete search history.

(56) References Cited

U.S. PATENT DOCUMENTS 6,268,741 B1* 7/2001 Sakata ..................... G11C 8/12
326/98
6,808,307 B1* 10/2004 Aslan ..................... G01K 1/028
374/E1.005
(Continued)

FOREIGN PATENT DOCUMENTS

DE 103 51 843 A1 6/2005
EP 2 270 983 A1 1/2011
(Continued)

OTHER PUBLICATIONS

Dziadecki A., et al., PL179296B1, Method and system for driving a power transistor mos, 1996, English translation downloaded from Google Patents on Nov. 26, 2023 (Year: 1996).*

(Continued)

*Primary Examiner* — Lina Cordero
*Assistant Examiner* — Lyudmila Zaykova-Feldman
(74) *Attorney, Agent, or Firm* — Crowell & Moring LLP

(57) ABSTRACT

A method and an electronic device monitors the temperature of power electronics having at least one power transistor. In the method, during active operation of the power transistor, the drain-source voltage and the drain current of the transistor are measured and are used to calculate an on-state resistance. An instantaneous junction temperature of the power transistor is determined for monitoring the temperature on the basis of a predefined assignment. The predefined assignment is automatically recalibrated for future operation of the power transistor by automatically measuring in each case a pair of values of the instantaneous on-state resistance and an instantaneous temperature of the power electronics in each case at a plurality of different times outside active operation. These temperatures are measured at a location spatially spaced apart from the junction of the power transistor and are assumed to be junction temperatures prevail- (Continued)

ing at the respective time. The assignment is then updated according to these pairs of values.

11 Claims, 2 Drawing Sheets

(51) Int. Cl.

| | |
|---|---|
| *H02M 1/32* | (2007.01) |
| *H03K 17/08* | (2006.01) |
| *H03K 17/082* | (2006.01) |
| *H10W 40/00* | (2026.01) |

(52) U.S. Cl.
CPC ........ *H03K 17/0822* (2013.01); *H10W 40/00* (2026.01); *H03K 2017/0806* (2013.01); *H03K 2217/0027* (2013.01)

(56) References Cited

U.S. PATENT DOCUMENTS

| | | | | |
|---|---|---|---|---|
| 8,299,767 | B1 * | 10/2012 | Tuozzolo | H02H 3/42 323/275 |
| 9,030,054 | B2 | 5/2015 | Jacobson et al. | |
| 2007/0210854 | A1 * | 9/2007 | Mangano | H03K 17/082 324/754.29 |
| 2009/0322409 | A1 * | 12/2009 | Levit | G06F 1/3296 327/513 |
| 2010/0079190 | A1 * | 4/2010 | Cortigiani | H03K 17/0822 327/378 |
| 2011/0128778 | A1 * | 6/2011 | Chen | G11C 11/1675 365/158 |
| 2011/0316606 | A1 * | 12/2011 | Ladurner | H03K 17/14 327/378 |
| 2012/0212064 | A1 | 8/2012 | Spanoche et al. | |
| 2013/0184887 | A1 * | 7/2013 | Ainsley | G05B 13/026 700/291 |
| 2013/0320891 | A1 * | 12/2013 | Merkel | H02P 21/0021 318/400.02 |
| 2015/0006937 | A1 * | 1/2015 | Rotem | G06F 1/3215 713/324 |
| 2015/0009730 | A1 * | 1/2015 | Pasqualetto | H03K 17/0822 363/56.03 |
| 2015/0012764 | A1 * | 1/2015 | Carlson | G06F 1/32 713/320 |
| 2015/0192637 | A1 * | 7/2015 | Falk | G06F 21/86 326/16 |
| 2016/0252402 | A1 * | 9/2016 | Singh | G01N 33/00 702/130 |
| 2017/0179944 | A1 * | 6/2017 | Ngo | H03K 17/145 |
| 2017/0308802 | A1 * | 10/2017 | Ramsøy | G06N 20/00 |
| 2018/0183228 | A1 * | 6/2018 | Huber | G01R 19/16571 |
| 2019/0086468 | A1 * | 3/2019 | Yoshino | G01R 31/2834 |
| 2019/0131863 | A1 * | 5/2019 | El Markhi | H02M 3/156 |
| 2019/0204889 | A1 * | 7/2019 | Kaeriyama | H02M 1/32 |
| 2019/0260371 | A1 * | 8/2019 | Wada | H01L 21/822 |
| 2020/0097032 | A1 * | 3/2020 | Katagiri | H03K 17/04206 |
| 2020/0269855 | A1 * | 8/2020 | Hinterberger | B60W 10/08 |
| 2020/0408834 | A1 * | 12/2020 | Sutaria | G01R 31/2884 |
| 2021/0044288 | A1 * | 2/2021 | Troyer | H02H 9/001 |
| 2021/0063467 | A1 * | 3/2021 | Kazmirski | G01R 31/007 |
| 2021/0200915 | A1 * | 7/2021 | Kumar | G06N 3/08 |
| 2021/0325257 | A1 * | 10/2021 | Steiner | H01L 23/34 |
| 2021/0325258 | A1 * | 10/2021 | Kapaun | G01K 7/01 |
| 2022/0034958 | A1 * | 2/2022 | Denk | G01R 31/2834 |
| 2022/0260630 | A1 * | 8/2022 | Fayneh | G01R 31/3016 |

FOREIGN PATENT DOCUMENTS

| | | | | | |
|---|---|---|---|---|---|
| PL | | 179296 | B1 * | 5/1996 | H02M 1/08 |
| WO | WO 2013/034400 | A1 | | 3/2013 | |

OTHER PUBLICATIONS

German-language Search Report issued in German Application No. 10 2020 116 424.6 dated Apr. 27, 2021 with partial English translation (14 pages).
Cover Page of EP 2 753 903 A1 published Jul. 16, 2014 (one (1) page).

* cited by examiner

METHOD AND ELECTRONIC DEVICE FOR MONITORING THE TEMPERATURE OF POWER ELECTRONICS, AND MOTOR VEHICLE

CROSS REFERENCE TO RELATED APPLICATION

This application claims priority under 35 U.S.C. § 119 from German Patent Application No. 10 2020 116 424.6, filed Jun. 22, 2020, the entire disclosure of which is herein expressly incorporated by reference.

BACKGROUND AND SUMMARY OF THE INVENTION

The present invention relates to a method and an electronic device for monitoring the temperature of power electronics and to a corresponding motor vehicle.

When using semiconductor-based electrical and electronic components, the operating temperature is an important factor for efficient and simultaneously safe operation. In the case of high load requirements, high temperatures may arise very quickly and can result in damage to the respective component part. If, in contrast, a reliable and operationally safe temperature range is not used up, a full power or performance of the respective component part accordingly often cannot be used up either. On account of the small structure sizes and the high packing density in modern electronic component parts and the installation space which is valuable in terms of costs, it is not readily possible to precisely and reliably measure the actual temperatures inside the electronic components.

An important parameter is the so-called junction temperature inside a semiconductor transistor or transistor chip. This temperature could be at least approximately directly measured by directly arranging a PN diode on the respective transistor chip, for example, the forward voltage of which diode varies linearly with the temperature. However, this uses valuable chip area, for example 15% to 20% of an active area of a chip, and is therefore not practical in many applications. Nowadays, a temperature sensor is therefore often arranged on a substrate or housing of a module comprising a plurality of power transistors in order to monitor the temperature. However, since the temperature inside such a module can vary significantly over the different power transistors, only a type of mean value of the temperatures inside the module can therefore be measured. A temperature measured in this manner is therefore referred to, for example, as a virtual junction temperature ($T_{jv}$). In addition, on account of the heat transfer coefficients and the thermal inertia of the material in between, such temperature sensors arranged at a certain distance from the actual junction often cannot be used to detect rapid temperature increases reliably or quickly enough to prevent damage.

Against this background, EP 2 270 983 A1, for example, discloses an integrated smart power switch. That document describes a controllable semiconductor device having a controller for controlling a first operating parameter according to predefined data, including a curve for a transient thermal impedance between a junction and a housing for a normal mode and an avalanche mode. If a comparison of the predefined data with a predicted value satisfies a particular condition, a condition for a safe operating range should then be determined on the basis, inter alia, of a reliability characteristic of the semiconductor device. Accordingly, safe and reliable operation of the semiconductor device should then be achieved by accordingly dynamically modifying the first operating parameter. It is also possible to use a method for calibrating installed power devices, in which a housing temperature of the device after pulse loading is observed. This method is based on the ability of a thermal impedance between a housing and a heat sink to handle power.

The junction temperature plays a role in another field of application, for example in photovoltaic panels as well. US 2012/0 212 064 A1 describes a method for controlling such a photovoltaic panel in a three-phase power generation system. The junction temperature can be calculated therein on the basis of a model of the panel, for example from a temperature on a rear side of the panel. The junction temperature is used, for example, to evaluate an electrical model of the panel. In this respect, the junction temperature can be measured directly if the panel has a corresponding temperature sensor which is integrated in a photovoltaic cell. However, the problem of the junction temperature being determined only indirectly or in a model-based manner and therefore with a delay and/or in an unreliable manner or a large amount of installation space accordingly being required for a specific temperature sensor is not circumvented here either.

Furthermore, U.S. Pat. No. 9,030,054 B2 describes a method for adaptively controlling a gate driver. A set of sensors can be used therein to detect a set of operating parameters of a semiconductor switch. In this case, this set of operating parameter comprises, inter alia, a junction temperature. The method for calibrating power devices, mentioned in connection with EP 2 270 983 A1, can also be used here. However, this method also does not provide for the junction temperature to be determined directly and can accordingly be unreliable. In addition, the sensors mentioned also require valuable installation space here and/or are arranged remotely from the actual junction and therefore the actual location of the relevant junction temperature.

The object of the present invention is to make it possible to reliably operate power electronics in a particularly simple and efficient manner. This object is achieved, according to the invention, by the subjects of the independent patent claims. Advantageous configurations and developments of the present invention are stated in the dependent patent claims, in the description and in the drawing.

A method according to the invention is used to monitor the temperature of power electronics, that is to say a power electronic device, comprising at least one power transistor. Such power electronics may be or comprise, for example, a converter, in particular as part of a drive train of an electrical motor vehicle. In principle, however, the present invention can be used in a wide variety of other scenarios and fields of application.

In the method according to the invention, during active operation of the power transistor, a drain-source voltage and a drain current are measured for the transistor and are used to calculate an on-state resistance of the power transistor. For example, the on-state resistance—also referred to as the on resistance or minimum volume resistance—can be calculated in the active, that is to say switched-on, state of the power transistor as $RDS(on) = U_{ds}/I_d$ using the drain-source voltage $U_{ds}$ applied to the power transistor and the drain current $I_d$ flowing through the power transistor. Active operation or a switched-on state of the power transistor here means its operation with an intended power request from the power transistor or a corresponding provision of power by the power transistor, that is to say, for example, operation of the power transistor or of the power electronics in order to provide supply, operating or drive power or energy for an electrical load connected to the power electronics. In this case, the drain-source voltage and the drain current can be measured each time the power transistor is in active operation or, for example, at predefined intervals of time. A, possibly continuous, measurement whenever the power transistor is actively operated can advantageously ultimately enable particularly reliable and seamless temperature monitoring and therefore a particularly fast response to undesirable temperature changes. In contrast, a measurement which is carried out only at predefined intervals or at predefined times or under predefined conditions can advantageously save measurement and evaluation effort and therefore ultimately energy, for example.

Furthermore, in the method according to the invention, a junction temperature of the power transistor that is assigned or can be assigned to the calculated on-state resistance, that is to say a corresponding junction temperature, is determined on the basis of a predefined assignment as a key figure for monitoring the temperature. The latter means that the temperature is monitored on the basis of the junction temperature determined in this manner. For example, a temperature limit value predefined for monitoring the temperature or a permissible temperature range can therefore apply to the junction temperature determined in this manner. The predefined assignment may be an assignment rule which assigns an associated junction temperature to a given on-state resistance. This assignment or assignment rule may be predefined, for example, in the form of a table, a function, a family of characteristics or the like. In the manner described here, the junction temperature can be determined in a particularly simple manner and possibly without additional or dedicated component parts or components. On account of the particularly small amount of measurement and evaluation effort required for this, that is to say the particularly small amount of data or signal processing effort, a—possibly continuous or regularly repeated—determination and monitoring of the junction temperature, in particular at least substantially in real time, are thus enabled during active operation of the power transistor or the power electronics.

In this case, it could be problematic, in principle, that thermal and/or electrical properties of the power transistor can change over time in a manner which cannot be reliably predicted. Therefore, the predefined assignment might then become incorrect over time, that is to say might no longer correspond to the real conditions. This can generally happen, for example, as a result of degradation of the power transistor or its performance in a gradual period which extends over weeks to years, for example. The result may be, for example, displacements in a crystal lattice, material fatigue or material changes and the like of the power transistor itself and/or of component parts surrounding the latter. For example, a thermal connection or cooling of the power transistor may change over time and partial delamination of material layers and/or the like may occur, as a result of which the on-state resistance or a characteristic curve, which describes a relationship between the drain-source voltage and the drain current or the on-state resistance and the junction temperature, can ultimately be changed in each case.

In order to counteract this problem, the method according to the invention provides for the predefined assignment to be automatically recalibrated for respective future operation of the power transistor or the power electronics. For this purpose, in each case a pair of values of the respective instantaneous on-state resistance of the power transistor and an instantaneous temperature of the power electronics is automatically measured in each case at a plurality of different times in each case outside active operation, that is to say outside active operating times or switched-on times, of the power transistor. In other words, the on-state resistance and the temperature are therefore each measured several times in succession at least substantially at the same time during an inactivity, non-operational or rest time of the power transistor. On account of the interval of time between these times, there are also different temperatures, for example since the power transistor or the power electronics has/have been cooled in the meantime.

These measured temperatures are measured in this case at a location spatially spaced apart from the junction of the power transistor and are assumed to be junction temperatures, that is to say temperatures of the junction of the power transistor, prevailing or present at the respective time. These measured temperatures can be measured, for example, at a location of the power electronics which is accessible directly, in particular more easily than the actual junction. This may be, for example, a location of a chip or semiconductor substrate, for example a ceramic carrying the power transistor, a location of a module comprising the power transistor, of a housing of the power transistor, of the module or of the power electronics or the like. Accordingly, the temperatures may therefore be measured substrate, module or housing temperatures, for example.

According to the invention, the predefined assignment is then updated, that is to say newly determined or newly calibrated, according to the respective measured pairs of values. This recalibration or updating of the predefined assignment can be regularly repeated. It can therefore be permanently ensured that the junction temperature can be accurately and reliably determined from the drain-source voltage measured during active operation of the power transistor and the drain current of the power transistor which is measured in the process. The changes or ageing phenomena mentioned are therefore taken into account or compensated for by the recalibration of the predefined assignment that is provided according to the invention.

The measurements of the pairs of values of the on-state resistance and the measured temperature of the power electronics—also referred to as the measurement temperature below—are carried out while the power transistor is not being actively operated for the purpose of supplying or operating a connected load. These measurements can preferably be carried out for the recalibration in a calibration period which follows active operation or use of the power transistor or the power electronics and in which the latter cool from an operating temperature to an ambient temperature. In such a cooling phase, it can be assumed that there is an at least substantially homogeneous temperature distribution over the power transistor and component parts surrounding the latter. At least parts of the power electronics which comprise the power transistor and a temperature sensor provided for the purpose of measuring the measurement temperature can therefore have at least substantially the same temperature. The measurement temperature measured under such conditions therefore corresponds at least substantially to the actual junction temperature even if the measurement temperature is measured at a spatial distance from the junction. As a result of this fact or this knowledge being used according to the invention, the junction temperature can therefore ultimately be determined and monitored without sacrificing chip surface in a cost-intensive manner for a modified temperature sensor and nevertheless in a permanently reliable manner.

The present invention is therefore based on the concept of using the on-state resistance as a temperature sensor during operation, that is to say during a switched-on time of the power transistor. The on-state resistance has a positive temperature coefficient and increases with the temperature. The measured variables $U_{ds}$ and $I_d$ which are used to determine or calculate the on-state resistance are known anyway for the operation of the power transistor and can be accurately and reliably measured in a known relatively simple manner.

In a particularly preferred manner, the power transistor may be an SiC MOSFET, that is to say the method according to the invention may be used to monitor the temperature of silicon-carbide-based power components. It has been found that the described problem of the change in thermal and electrical properties can be particularly pronounced with this technology, for example on account of the relatively high band gap, a gate oxide inside the SiC MOSFET and the like. The result here may be, for example, charge accumulations or traps as well as hysteresis-like changes in the thermal and/or electrical properties or corresponding characteristic curves, with the result that a prediction is not practically possible. The present invention can therefore be used in a particularly beneficial manner for this SiC-based technology. However, the invention can likewise be used, in principle, for other technologies.

In an advantageous configuration of the present invention, a temporal change in the assignment is captured over a plurality of recalibration operations or updates. A warning or maintenance notice is then automatically output if the captured change in the assignment satisfies a predefined criterion. This may mean, for example, that the captured, in particular cumulative, change has reached or exceeded a predefined threshold value. As part of the criterion, it is likewise possible to check whether the change has or exceeds a predefined rate of change or speed of change or has a particular pattern. Such a pattern may be, for example, a gradual, constant or uniform change in the assignment or a sudden change in the assignment. As already indicated, the change in the assignment may be caused by degradation of the power transistor itself or, for example, by wear, damage, or other impairment of other component parts or components. For example, delamination in the chip substrate may result in an increase in the on-state resistance, an increased junction temperature and/or a poorer dissipation of heat from the power transistor. A similar effect may occur, for example, if a cooling system provided for the purpose of cooling the power transistor is partially blocked. If appropriate, however, there may be different types, forms or patterns of the change in the assignment over time. In principle, the change or shift in the assignment or calibration can be taken as a basis for detecting that there has been a—typically undesirable—change in the region of the power electronics, that is to say there is possibly a problem or a fault or failure may be imminent. In this case, the thermal and/or electrical properties can change relatively slowly, for example over weeks, months or years, in which case the power transistor and the power electronics still function, that is to say can be used or operated, albeit possibly at higher temperatures and/or with reduced efficiency. These effects can already be detected and tracked before actual failure of the power transistor or the power electronics by capturing and evaluating the temporal changes in the assignment. This enables timely maintenance or timely replacement of affected component parts or components in a controlled manner, that is to say, for example, without unforeseen or unplanned interruption in operation, with an accordingly minimum downtime and minimum risk. If appropriate, a cause of this change can be detected or determined on the basis of the type or pattern of the change in the assignment, as a result of which the component part causing the change can be advantageously maintained or replaced in a targeted manner. This makes it possible to save effort and costs, if appropriate.

In a further advantageous configuration of the present invention, the temperature for the recalibration, that is to say the measurement temperature mentioned, is measured by means of a temperature sensor which is arranged on a substrate of the power transistor or of a module of the power electronics which comprises the power transistor. Such a temperature sensor may be an NTC thermistor, for example. Arranging the temperature sensor on or at the substrate makes it possible to ensure, on the one hand, that the measurement temperature captured there corresponds at least substantially to the junction temperature outside active operation of the power transistor, that is to say, for example, during a cooling phase after operation or in a thermal state of equilibrium. On the other hand, however, both the temperature sensor itself and the module can be produced in a particularly cost-effective and compact manner in this way. There is advantageously a certain degree of flexibility with regard to the arrangement of the temperature sensor. As a result, the method according to the invention can be flexibly used for different types of power electronics. It is also particularly advantageous in this case that such temperature sensors are often present anyway in currently used power electronic devices, for example on a ceramic substrate or housing. The method according to the invention can therefore be used without any changes or with minimal changes, in particular without additional component parts for existing power electronics.

In a further advantageous configuration of the present invention, the power electronics have a desaturation detection circuit. The drain-source voltage is then measured using this desaturation detection circuit in order to determine the on-state resistance during active operation of the power transistor. Such a desaturation detection circuit is typically used to detect short-circuit currents in the event of a fault and can protect power semiconductor switches, for instance IGBTs or MOSFETs, from short-circuit currents which can otherwise result in the destruction of the power semiconductor switches. Problematic desaturation of the semiconductors can likewise occur on account of an insufficient gate driver signal. In order to prevent resulting damage to the respective power semiconductors, that is to say here, in particular, to the power transistor, desaturation detection circuits are often present anyway in nowadays widespread power electronics. The use of this desaturation detection circuit to recalibrate the temperature monitoring, as proposed in the present case, then advantageously makes it possible to use the present invention without any additional effort or with particularly little additional effort since component parts or structures which are already present can be concomitantly used. If appropriate, the existing desaturation detection circuit can be adapted to measure the actual value of the drain-source voltage instead of only providing for a comparison of this value. However, this constitutes a minimal adaptation, for example in comparison with the installation of a separate circuit for measuring the voltage.

In a further advantageous configuration of the present invention, the drain-source voltage is measured only after a predefined settling time after a respective operation of switching on the power transistor has elapsed and in each case is measured only when a respective switched-on duration, which remains after the settling time and for which the power transistor remains switched on without interruption, corresponds at least to a predefined minimum duration. The switching-on of the power transistor may here mean or comprise, in particular, changing it to active operation. The switching-on of the power transistor may likewise mean in this sense switching it to the on state in a period of pulsed, for example pulse-width-modulated (PWM), active operation. In the present case, the drain-source voltage—and possibly also the drain current—is therefore not measured in each case at the moment at which the power transistor is respectively switched on or immediately afterward, but rather only after a predefined period (blanking time) has elapsed. During pulse-width-modulated operation, the drain-source voltage—and possibly the drain current—is then also measured within a PWM pulse only when a sufficient active operating time or switched-on time of the power transistor remains in this pulse to enable a stable measurement. The switched-on time remaining after the settling time can therefore then be determined by a respective duty cycle. For example, at a PWM frequency of 20 kHz, that is to say a period duration of 50 µs, its first 3-6 µs in each case can be considered to be the settling time. Provision may then be made, for example, for the drain-source voltage—and possibly the drain current—to be measured in this PWM pulse only when the duty cycle has been set in such a manner that the uninterrupted switched-on time is at least 20% of the period duration, that is to say is at least 10 µs in the present example. The switched-on duration remaining after the settling time would therefore be, for example, 7-4 µs in the present example, which may be sufficient for a stable measurement. As a result of the conditions proposed here for measuring the drain-source voltage during active operation of the power transistor, the on-state resistance and therefore ultimately the junction temperature can be advantageously determined in a particularly reliable manner and particularly accurate and reliable temperature monitoring can therefore be ensured.

In a further advantageous configuration of the present invention, an electrical machine is connected to the power electronics. A current vector is then automatically determined for the recalibration of the assignment and can be used to guide a current through the electrical machine in a torque-free manner, that is to say without producing a torque in the electrical machine. A current having the determined current vector is then guided through the power transistor and into the electrical machine in order to measure the on-state resistance during the recalibration or for the recalibration. The current vector may have been determined or may be determined, for example, on the basis of a position of a rotor of the electrical machine relative to its stator. In order to determine the current vector, a corresponding position signal from a corresponding position sensor can therefore be captured. The electrical machine, for example a drive motor of an electrical motor vehicle, is therefore used here as the electrical load connected to the power transistor. A current introduced into the power transistor in this case may have a predefined intensity or magnitude. This may be, for example, at most 20%, preferably at most 10%, of a maximum current-carrying capacity, that is to say a maximum current intensity of the power transistor according to the specifications. If the motor vehicle is used, this current intensity of the current which is directed or guided through the power transistor with the determined current vector in order to measure the on-state resistance for the recalibration may be approximately 100 A, for example. Specifying a corresponding current intensity makes it possible to deter-mine the on-state resistance in a particularly reliable manner without simultaneously causing an excessive energy consumption. The determined current vector makes it possible to advantageously carry out the recalibration without undesirable effects or influences of a device driven by the electrical machine. For example, the recalibration can then be carried out without a motor vehicle equipped with the electrical machine moving. This provides both temporal and situational flexibility and corresponding safety for using the method according to the invention. In addition, the recalibration can therefore be carried out in a transparent manner for a respective user, that is to say can be carried out in a manner unnoticed by the latter, thus being able to result in particularly high comfort of use.

In an alternative approach, the power electronics may comprise a corresponding auxiliary circuit for measuring the on-state resistance outside active operation of the power transistor for the recalibration, for example as part of a gate driver for the power transistor. The recalibration can therefore be advantageously controlled independently of external conditions, for example if no external load is connected to the power electronics or no corresponding torque-free current vector can be determined.

In a further advantageous configuration of the present invention, the junction temperature is repeatedly determined several times during active operation of the power transistor. A power reduction of the power transistor or the power electronics is then automatically controlled on the basis thereof according to a predefined rule. Such a rule may be or comprise, for example, a power reduction function or a derating curve. Derating, that is to say downgrading of the power transistor or of its instantaneous performance, can therefore be automatically carried out if the junction temperature reaches or exceeds a predefined threshold value. A current or a power can then be automatically reduced, for example. If it is then revealed, during subsequent determination of the junction temperature, that the latter has fallen below the predefined threshold value or below a lower, second predefined threshold value, the derating can be at least partially canceled. Accordingly, the current or the power can therefore then be automatically increased again. This makes it possible to make particularly effective use of a performance of the power transistor under the given conditions in each case without the need for an accordingly complicated model or complicated capture of environmental or usage conditions, for example. Since the junction temperature can be determined in a particularly accurate and reliable manner by means of the method according to the invention in the present case, a power yield of the power transistor can be maximized in a particularly safe manner.

In a further advantageous configuration of the present invention, a predefined starting temperature of the power electronics and/or a predefined temperature profile while respectively measuring the pairs of values of the on-state resistance and the measurement temperature for the recalibration is/are automatically set or enforced for the recalibration by means of a device for thermal preconditioning. It can therefore be advantageously ensured in a particularly reliable and flexible manner that a sufficiently wide range of different temperatures to enable accurate and reliable recalibration is run through outside active operation of the power transistor, that is to say for the recalibration or in a corresponding recalibration period. Reliable recalibration is therefore possible, for example, even after only relatively short or not very power-intensive active operation of the power transistor or the power electronics. It can likewise be advantageously ensured that the recalibration is carried out in a particular temperature range in which, for example, the thermal and electrical properties of the power electronics are known or correspond to predefined parameters. A particularly homogeneous temperature of the components or component parts of the power electronics can likewise be ensured, for example, by means of the device for thermal preconditioning. Such a device for thermal preconditioning can be provided anyway for operating the power electronics or a component connected to the latter, with the result that the method can then be advantageously carried out, that is to say used, without any additional outlay on component parts. In the automotive sector, such a device for thermal preconditioning can be provided, for example, for the purpose of controlling the temperature of a traction battery.

A further aspect of the present invention is an electronic device having at least one power electronic component with at least one power transistor. The electronic device according to the invention also has a measurement circuit for measuring a drain-source voltage and a drain current of the at least one power transistor during active operation of the latter and for measuring an on-state resistance of the power transistor and a temperature of the power electronics at a location spaced apart from a junction of the power transistor. The electronic device according to the invention also has a monitoring device which is configured to automatically carry out at least one embodiment or variant of the method according to the invention for monitoring the temperature of the electronic device on the basis of a junction temperature of the power transistor. The electronic device according to the invention may be or comprise, in particular, the power electronics mentioned in connection with the method according to the invention, for example as the power electronic component. The electronic device according to the invention may likewise have or comprise some or all of the features and/or devices mentioned in connection with the method according to the invention. This may concern, for example, the temperature sensor, the desaturation detection circuit, the electrical machine, a device for automatically determining the torque-free current vector, a power reduction or derating device, the device for thermal preconditioning and/or the like.

A further aspect of the present invention is a motor vehicle having at least one electronic device according to the invention, in particular as part of an electrical drive train of the motor vehicle. As indicated at the outset, the electronic device may be or comprise, for example, a converter of a motor vehicle. The motor vehicle according to the invention may be, in particular, the motor vehicle mentioned in connection with the method according to the invention and/or the electronic device according to the invention.

Further features of the invention may emerge from the claims, the figures and the description of the figures. The features and combinations of features mentioned above in the description and the features and combinations of features shown below in the description of the figures and/or shown in the figures alone can be used not only in the respectively stated combination, but also in other combinations or alone, without departing from the scope of the invention.

Other objects, advantages and novel features of the present invention will become apparent from the following detailed description of one or more preferred embodiments when considered in conjunction with the accompanying drawings.

DETAILED DESCRIPTION OF THE DRAWINGS

In power electronic applications, knowledge of a junction temperature of a power semiconductor device which is as accurate as possible may be important in order to detect whether or not a maximum rating of the device has been reached. In this case, it would be particularly advantageous to measure the junction temperature in real time in order to make it possible for the device or a control system to make an accordingly prompt decision regarding derating of the device.

Nowadays, many IGBT and MOSFET modules have an NTC thermistor for measuring the temperature. In this case, this NTC thermistor is arranged, for example, on a substrate in the vicinity of a power semiconductor chip and can therefore measure the actual junction temperature only indirectly. The temperature measured by means of the NTC thermistor can then be used as the input value for a thermal model in order to approximately calculate the junction temperature. However, this conventional method is fraught with inaccuracies and uncertainties, for example on account of the arrangement and thermal connection of the NTC thermistor and simplifications and inaccuracies in the thermal model used. In principle, although slow and long-term thermal overloads can be detected using the NTC thermistor, it is not readily reliably possible to detect fast or brief temperature peaks and to provide appropriate protection.

It should also be taken into account that power semiconductor chips are nowadays often arranged or combined in a module in a parallel manner. In this case, a thermal impedance between the power semiconductor chips and a heat sink of the module may vary, that is to say may be non-uniform or inhomogeneous, and there may be different thermal couplings between the power semiconductor chips themselves. During operation, the temperatures of the power semiconductor chips inside a module are therefore typically different in practice. This has hitherto been taken into account, for example, by means of a virtual junction temperature which can be understood as meaning the average temperature of the power semiconductor chips of a module. However, for improved and more reliable operation, an accurate and simple possibility for real-time measurement or real-time monitoring of the actual junction temperatures in the region of the semiconductor-based power electronics would be desirable.

Figure 1:
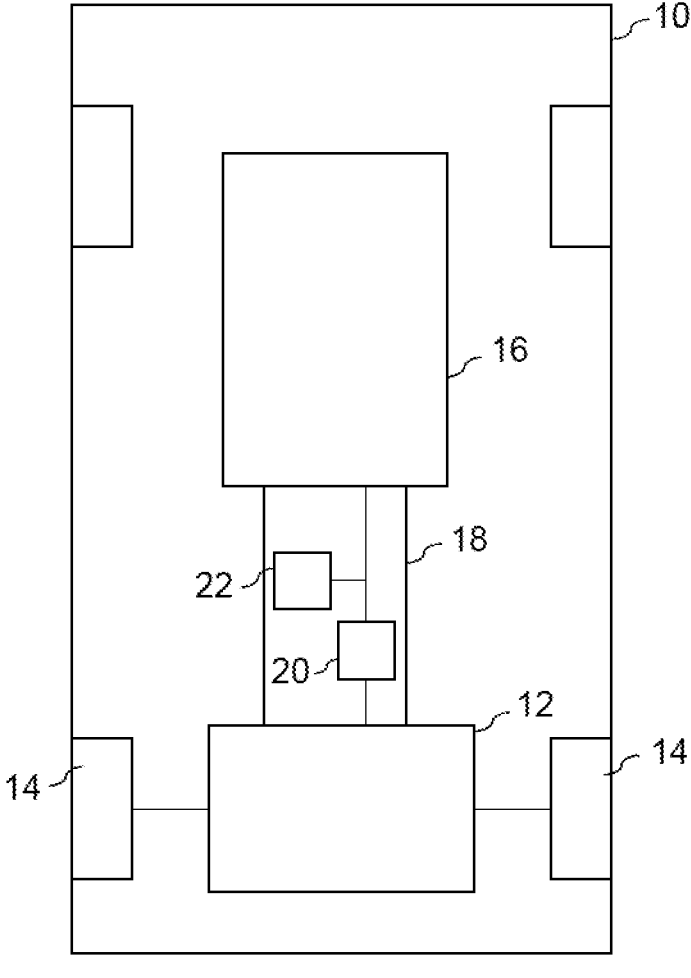
FIG. 1 shows a schematic illustration of a motor vehicle having an electrical drive train.

An application for this is in the automotive sector. In this respect, FIG. 1 shows a schematic illustration of a motor vehicle 10 having an electrical drive train. In the present case, the latter comprises an electrical machine 12 which here is in the form of a traction motor of the motor vehicle 10 for driving its wheels 14, for example. The electrical machine 12 is supplied here from a traction battery 16 of the motor vehicle 10. For this purpose, a converter 18 is connected in the present case between the traction battery 16 and the electrical machine 12. This converter 18 here comprises semiconductor-based devices for supplying power to the electrical machine 12 which are schematically represented here by a power semiconductor 20. This power semiconductor 20 may comprise at least one power transistor, in particular at least one SiC MOSFET. The converter 18 also has a control unit 22. The latter may comprise one or more measurement devices or measurement circuits and one or more data or signal processing devices.

Figure 2:
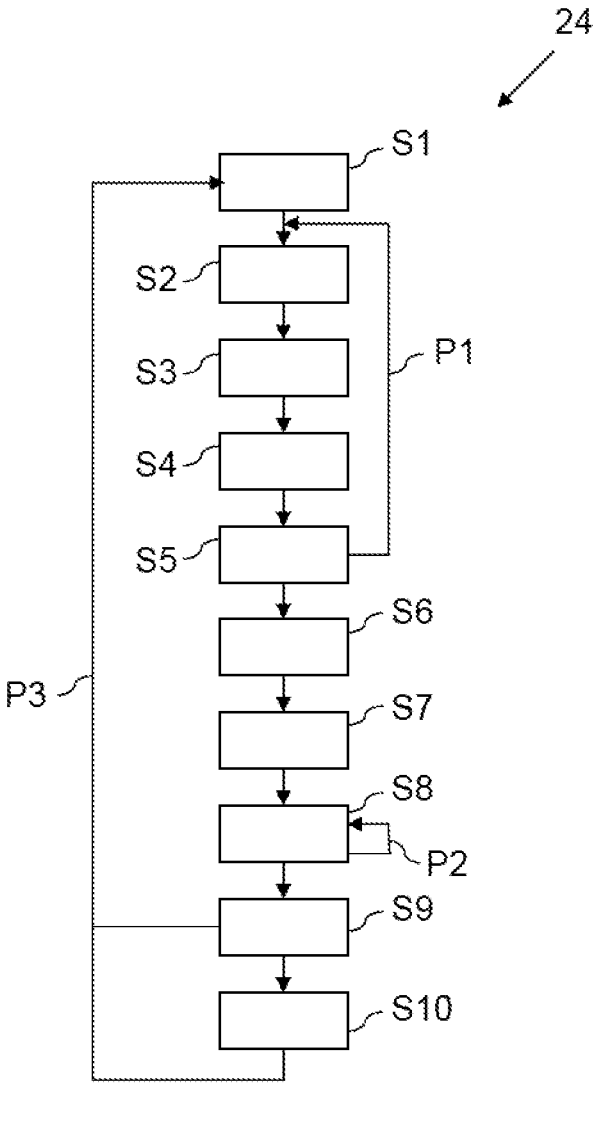
FIG. 2 shows an exemplary schematic flowchart for a method for monitoring the temperature of power electronics of the drive train.

The converter 18, in particular the control unit 22, is configured here for a method for monitoring the temperature of the power semiconductor 20. In this respect, FIG. 2 shows an exemplary schematic flowchart 24 for a corresponding method.

In a method step S1, the power semiconductor 20 is changed to active operation, that is to say is switched on. This can be carried out, for example, at the beginning and during a journey of the motor vehicle 10 in order to supply the electrical machine 12 with electrical power.

In a method step S2, during this active operation of the power semiconductor 20, that is to say during its switched-on time, a drain-source voltage applied via the drain and source and a drain current are measured for the power semiconductor 20 after a predefined settling time has elapsed. The drain-source voltage can be measured, for example, using an appropriately configured desaturation detection circuit. For operation of the power semiconductor 20 or driving operation of the motor vehicle 10, the drain current must be measured or known anyway, for instance in order to control a torque of the electrical machine 12. Corresponding measured values of the drain-source voltage and of the drain current are combined with one another in a method step S3 in order to calculate the on-state resistance of the power semiconductor 20 in the switched-on state (RDS(on)). The measurements in method step S2 and the calculation of the on-state resistance in method step S3 can be carried out at least virtually in real time during active operation of the power semiconductor 20.

The instantaneous junction temperature of the power semiconductor 20 is likewise determined at least virtually in real time, that is to say, for example, with time delays in the microsecond range or of a few milliseconds, on the basis of the calculated on-state resistance in a method step S4. For this purpose, a predefined assignment, for example a corresponding assignment or lookup table, is queried or evaluated using the calculated on-state resistance as an input or query value in order to determine the junction temperature associated with this on-state resistance according to the predefined assignment.

On the basis of the instantaneous junction temperature of the power semiconductor 20 determined in this manner, corresponding temperature management can then be carried out in a method step S5. For this purpose, the determined junction temperature can be compared, for example, with a predefined temperature threshold value or temperature range. Depending on a result of this comparison, derating of the power semiconductor 20 can then be automatically controlled or set, for example, or current or power limitation for the power semiconductor 20 can be automatically adapted, for example.

As schematically indicated here by a loop-like program path P1, method steps S2 to S5 can be repeatedly run through during active operation.

In a method step S6, operation can be stopped in the present case, that is to say active operation of the power semiconductor 20 or of the converter 18 or, in the present case, of the motor vehicle 10 can be ended. This can be carried out, for example, at the end of a journey when the motor vehicle 10 is parked in a parking position. For example, the motor vehicle 10 can then be connected to a charging station for charging the traction battery 16, that is to say, in particular, can no longer be in driving operation with corresponding power requirements of the electrical machine 12.

In a method step S7, the temperature is adapted or adjusted. In this case, after the preceding active operation, a temperature equilibrium or an at least substantially homogeneous temperature distribution is established in the power semiconductor 20 or the power electronic components of the converter 18, for example. This may take place, for example, during a cooling phase of the converter 18 or of the power semiconductor 20 from a preceding operating temperature. It is possible to wait for several minutes, for example, for this. A predefined temperature or temperature change of the converter 18 or of the power semiconductor 20 can likewise also be effected or set here by means of a device for thermal preconditioning which is not illustrated in any more detail, for example of the traction battery 16.

After an appropriate adjustment phase, that is to say when it can be assumed that the at least substantially homogeneous temperature distribution has been reached, the on-state resistance and a measurement temperature are measured in a method step S8. In order to measure the on-state resistance, a predefined current can be guided through the power semiconductor 20, wherein the electrical machine 12 can be used as a load, for example. This can be carried out without producing or causing a torque in the electrical machine 12, that is to say without the motor vehicle 10 moving. It can be assumed here that the junction temperatures of all transistors or chips of the power semiconductor 20 or of the converter 18, at least inside a module of the converter 18, a corresponding housing temperature and a temperature measured by a temperature sensor of the converter 18 at a location spaced apart from the junction(s) of the power semiconductor 20 are at least substantially the same. As schematically indicated here by means of a loop-like program path P2, this measurement temperature and the on-state resistance at a plurality of times and therefore at a plurality of different temperatures are each measured at least substantially at the same time.

In a subsequent method step S9, the assignment mentioned between on-state resistances and junction temperatures is updated on the basis of the pairs of values of simultaneously measured on-state resistances and measurement temperatures which are measured in method step S8.

Method steps S7 to S9 are therefore carried out outside an active operating time of the power semiconductor 20 and constitute recalibration of the temperature monitoring.

As schematically indicated here by means of a loop-like program path P3, the assignment updated in this manner or the recalibration of the temperature monitoring can then be used during the next activation of the power semiconductor 20—or of the motor vehicle 10 in the present case—to still enable the junction temperature of the power semiconductor 20 to be determined in an accurate and reliable manner during next active operation.

If appropriate, a temporal development or change in the assignment can be checked in a method step S10 optionally or, for example, at greater intervals of time. In the event of a particular change in the assignment, for example in comparison with an original initial or starting value, a corresponding warning or maintenance notice can be automatically output.

Overall, the described examples show how a method for measuring a junction temperature in real time with automatic calibration can be implemented, for example, for an inverter of an electric vehicle.

LIST OF REFERENCE SIGNS

10 Motor vehicle
12 Electrical machine
14 Wheels

16 Traction battery
18 Converter
20 Power semiconductor
22 Control unit
24 Flowchart
S1-S10 Method steps
P1-P3 Program paths The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for monitoring temperature of power electronics comprising at least one power transistor, the method comprising:

during active operation of the power transistor, measuring a drain-source voltage and a drain current for the power transistor and using the drain-source voltage and the drain current to calculate an on-state resistance;

determining an instantaneous junction temperature of the power transistor that is assigned to a calculated on-state resistance on the basis of a predefined assignment as a key figure for monitoring the temperature;

automatically recalibrating the predefined assignment for future operation of the power transistor by automatically measuring in each case a pair of values of an instantaneous on-state resistance of the power transistor and an instantaneous temperature of the power electronics in each case at a plurality of different times in each case outside active operation of the power transistor;

capturing a temporal change in an assignment over a plurality of recalibration operations and automatically outputting a warning indicating a need for maintenance on the power electronics in a case in which the captured temporal change satisfies a predefined criterion for a specific pattern of temporal change in the assignment, wherein the temperatures are measured at a location spatially spaced apart from a junction of the power transistor and are assumed to be junction temperatures prevailing at a respective time, and the assignment is updated according to the pairs of values, and all the junction temperatures are measured at a same time after a homogenous temperature distribution has been reached;

determining a cause of the temporal change in the assignment based on the specific pattern;

determining whether the instantaneous junction temperature reaches or exceeds a first threshold value and automatically reducing a current or a power of the power transistor based on such a determination; and determining whether the instantaneous junction temperature has fallen below a second threshold value that is lower than the first threshold value and automatically increasing the current or the power of the power transistor based on such a determination.

2. The method according to claim 1, wherein the predefined criterion is an exceeding of a predefined threshold value.

3. The method according to claim 1, wherein a temperature for the recalibration operations is measured by a temperature sensor, which is arranged on a substrate of a module comprising the power transistor.

4. The method according to claim 3, wherein the temperature sensor is an NTC thermistor.

5. The method according to claim 1, wherein the power electronics have a desaturation detection circuit and the drain-source voltage is measured using the desaturation detection circuit.

6. The method according to claim 1, wherein the drain-source voltage is measured only after a predefined settling time after a respective operation of switching on the power transistor has elapsed and, in each case, is measured only when a respective switched-on duration, which remains after the predefined settling time and for which the power transistor remains switched on without interruption, corresponds at least to a predefined minimum duration.

7. The method according to claim 1, wherein an electrical machine is connected to the power electronics, a current vector is automatically determined for the recalibration and is usable to guide a current through the electrical machine without producing a torque, and the current having the determined current vector is then guided through the power transistor and into the electrical machine in order to measure an on-state resistance during the recalibration.

8. A method for monitoring temperature of power electronics comprising at least one power transistor, the method comprising:

during active operation of the power transistor, measuring a drain-source voltage and a drain current for the transistor and using the drain-source voltage and the drain current to calculate an on-state resistance;

determining an instantaneous junction temperature of the power transistor that is assigned to the calculated on-state resistance on the basis of a predefined assignment as a key figure for monitoring the temperature;

automatically recalibrating the predefined assignment for future operation of the power transistor by automatically measuring in each case a pair of values of an instantaneous on-state resistance of the power transistor and an instantaneous temperature of the power electronics in each case at a plurality of different times in each case outside active operation of the power transistor;

capturing a temporal change in an assignment over a plurality of recalibration operations and automatically outputting a warning indicating a need for maintenance on the power electronics in a case in which the captured temporal change satisfies a predefined criterion for a specific pattern of change in the assignment, wherein the temperatures are measured at a location spatially spaced apart from a junction of the power transistor and are assumed to be junction temperatures prevailing at a respective time, and the assignment is updated according to the pairs of values, and all the junction temperatures are measured at a same time after a homogenous temperature distribution has been reached; and the junction temperature is repeatedly determined several times during active operation of the power transistor, and a power reduction of the power transistor is automatically controlled on the basis thereof according to a predefined rule;

determining a cause of the temporal change in the assignment based on the specific pattern;

determining whether the instantaneous junction temperature reaches or exceeds a first threshold value and automatically reducing a current or a power of the power transistor based on such a determination; and determining whether the instantaneous junction temperature has fallen below a second threshold value that is lower than the first threshold value and automatically increasing the current or the power of the power transistor based on such a determination.

9. The method according to claim 1, wherein a predefined starting temperature of the power electronics and/or a predefined temperature profile while respectively measuring the pairs of values is automatically set for the recalibration by a thermal preconditioning device.

10. An electronic device, comprising:

at least one power electronic component with at least one power transistor;

a measurement circuit for measuring a drain-source voltage and a drain current of the power transistor during active operation of the latter and for measuring an on-state resistance of the power transistor and a temperature of the power electronics at a location spaced apart from a junction of the power transistor; and a monitoring device for monitoring the temperature of an electronic device on the basis of a junction temperature of the power transistor, wherein the monitoring device is configured to automatically:

during active operation of the power transistor, measure a drain-source voltage and a drain current for the transistor and use the drain-source voltage and the drain current to calculate an on-state resistance;

determine an instantaneous junction temperature of the power transistor that is assigned to a calculated on-state resistance on the basis of a predefined assignment as a key figure for monitoring the temperature;

automatically recalibrate the predefined assignment for future operation of the power transistor by automatically measuring in each case a pair of values of an instantaneous on- state resistance of the power transistor and an instantaneous temperature of the power electronics in each case at a plurality of different times in each case outside active operation of the power transistor; and capture a temporal change in an assignment over a plurality of recalibration operations and automatically output a warning indicating a need for maintenance on the power electronics in a case in which the captured temporal change satisfies a predefined criterion for a specific pattern of change in the assignment, wherein the temperatures are measured at the location spatially spaced apart from the junction of the power transistor and are assumed to be junction temperatures prevailing at a respective time, and the assignment is updated according to the pairs of values, and all the junction temperatures are measured at a same time after a homogenous temperature distribution has been reached;

determine a cause of the temporal change in the assignment based on the specific pattern;

determine whether the instantaneous junction temperature reaches or exceeds a first threshold value and automatically reduce a current or a power of the power transistor based on such a determination; and determine whether the instantaneous junction temperature has fallen below a second threshold value that is lower than the first threshold value and automatically increase the current or the power of the power transistor based on such a determination.

11. A motor vehicle, comprising:

at least one electronic device according to claim 10, wherein the electronic device is part of an electrical drive train.

* * * * *